United States Patent
Ogawa et al.

(10) Patent No.: US 8,039,867 B2
(45) Date of Patent: Oct. 18, 2011

(54) ZNO-CONTAINING SEMICONDUCTOR LAYER, ITS MANUFACTURE METHOD, AND SEMICONDUCTOR LIGHT EMITTING DEVICE

(75) Inventors: Akio Ogawa, Yamato (JP); Michihiro Sano, Odawara (JP); Hiroyuki Kato, Yokohama (JP); Naochika Horio, Yokohama (JP); Hiroshi Kotani, Yokohama (JP); Tomofumi Yamamuro, Kawasaki (JP)

(73) Assignee: Stanley Electric Co., Ltd., Tokyo (JP)

( * ) Notice: Subject to any disclaimer, the term of this patent is extended or adjusted under 35 U.S.C. 154(b) by 135 days.

(21) Appl. No.: 12/540,772

(22) Filed: Aug. 13, 2009

(65) Prior Publication Data

US 2009/0294758 A1 Dec. 3, 2009

Related U.S. Application Data

(63) Continuation of application No. PCT/JP2008/000348, filed on Feb. 26, 2008.

(30) Foreign Application Priority Data

Feb. 27, 2007 (JP) ................................ 2007-048070

(51) Int. Cl.
*H01L 33/00* (2010.01)
(52) U.S. Cl. ..... 257/102; 257/13; 257/76; 257/E21.527; 438/104
(58) Field of Classification Search ........................ None
See application file for complete search history.

(56) References Cited

U.S. PATENT DOCUMENTS

| 6,770,913 | B2 | 8/2004 | Iwata et al. | |
|---|---|---|---|---|
| 2002/0014631 | A1* | 2/2002 | Iwata et al. | ............ 257/89 |
| 2003/0042851 | A1 | 3/2003 | Iwata et al. | |

FOREIGN PATENT DOCUMENTS

| EP | 1 178 543 A1 | 2/2002 |
|---|---|---|
| EP | 1 291 930 A2 | 3/2003 |
| JP | 2002-016285 A | 1/2002 |
| JP | 2002-118330 A | 4/2002 |
| JP | 2003-081698 A | 3/2003 |
| JP | 2004-221352 A | 8/2004 |
| JP | 2004-296459 A | 10/2004 |
| JP | 2004296459 A * | 10/2004 |
| JP | 2005-268196 A | 9/2005 |
| WO | WO 2007/015330 A1 | 2/2007 |

OTHER PUBLICATIONS

K. Iwata et al., "Bandgap Engineering of ZnO Using Se," phys. Stat. Sol. (B) 229, No. 2, 887-890 (2002).
English Language International Search Report dated Apr. 1, 2008 issued in parent Appln. No. PCT/JP2008/000348.
Japanese language PCT/ISA/220, International Preliminary Examination Report and Written Opinion dated Apr. 1, 2008 (and Partial English language translation thereof) issued in Application No. PCT/JP2008/000348.

* cited by examiner

*Primary Examiner* — Evan Pert
*Assistant Examiner* — Scott R Wilson
(74) *Attorney, Agent, or Firm* — Holtz, Holtz, Goodman & Chick, P.C.

(57) ABSTRACT

A ZnO-containing semiconductor layer, doped with Se, has an emission peak wavelength in visual light and has a band gap equivalent to a band gap of ZnO.

15 Claims, 10 Drawing Sheets

ZNO-CONTAINING SEMICONDUCTOR LAYER, ITS MANUFACTURE METHOD, AND SEMICONDUCTOR LIGHT EMITTING DEVICE

CROSS REFERENCE TO RELATED APPLICATION

This application is a continuation application of PCT/JP2008/000348 filed on Feb. 26, 2008 which claims priority of JP2007-048070 filed on Feb. 27, 2007, the entire contents of which are incorporated herein by reference.

BACKGROUND OF THE INVENTION

1. Field of the Invention

The present invention relates to a ZnO-containing semiconductor layer, its manufacture method, and a semiconductor light emitting device, and more particularly to a ZnO-containing semiconductor layer suitable for emission of visual light, its manufacture method, and a semiconductor light emitting device capable of being manufactured by using such a ZnO-containing semiconductor layer as an emission layer.

2. Description of the Related Art

A transition energy between bands of zinc oxide (ZnO) corresponds to an emission energy in a ultraviolet range of about 370 nm. This wavelength is shorter than a visual light range of 400 nm or longer providing a high industrial usage value. Studies have been made to obtain emission at a wavelength longer than 400 nm.

Techniques of narrowing a band gap (gap narrowing) are known as one of the techniques of obtaining emission at a longer wavelength from a ZnO-containing compound semiconductor layer. For example, ZnCdO mixed crystal replacing a portion of Zn with Cd has been proposed in which the band gap can be adjusted in a range of 3.4 eV to 1.5 eV depending on a composition of Cd. However, since Cd is a highly toxic element, adopting ZnCdO mixed crystal is difficult from the viewpoint of safety.

For example, Japanese Patent Laid-open Publication No. 2002-16285 discloses techniques of gap narrowing of a band gap of ZnO by replacing a portion of O with a group VI element of sulfur (S) or selenium (Se) and forming mixed crystal. The techniques are excellent from the viewpoint of safety, as compared to the techniques of introducing Cd.

Japanese Patent Laid-open Publication No. 2002-16285 also discloses a light emitting device by sandwiching a gap-narrowed ZnO-containing compound semiconductor layer (ZnOS layer, ZnOSe layer) between ZnMgO clad layers. According to K. Iwata et al: Phys. Stat. sol (b) 229, No. 2 (2002)887, a relation between an Se composition y and a band gap of $ZnO_{1-y}Se_y$ ($0 \leq y \leq 1$) is represented by:

$$E_{ZnOSe} = yE_{ZnSe} + (1-y)E_{ZnO} - b(1-y)y$$

where $E_{ZnOSe}$, $E_{ZnSe}$ and $E_{ZnO}$ are band gaps of $ZnO_{1-y}Se_y$, ZnSe and ZnO, respectively, and b is a bowing parameter. The bowing parameter b is 12.7 eV.

Various techniques have been desired for obtaining emission of visual light from ZnO-containing compound semiconductor. Manufacturing techniques are also desired for manufacturing a semiconductor light emitting device capable of obtaining desired color by using, for example, ZnO-containing compound semiconductor for an emission layer.

SUMMARY OF THE INVENTION

It is an object of the present invention to provide a ZnO-containing semiconductor layer suitable for emission of visual light, its manufacture method, and a semiconductor light emitting device using such a ZnO-containing semiconductor layer as an emission layer.

It is another object of the present invention to provide a semiconductor light emitting device capable of obtaining desired color by using as an emission layer a ZnO-containing semiconductor layer suitable for emission of visual light.

It is still another object of the present invention to provide a semiconductor light emitting device having a novel structure capable of obtaining desired color.

According to a first aspect of the present invention, there is provided a ZnO-containing semiconductor layer doped with Se, having an emission peak wavelength in visual light, and having a band gap equivalent to a band gap of ZnO.

According to a second aspect of the present invention, in the ZnO-containing semiconductor layer of the first aspect, the emission peak wavelength is in a range of 430 nm or longer to 490 nm or shorter.

According to a third aspect of the present invention, in the ZnO-containing semiconductor layer of the first aspect, the emission peak wavelength is in a range of 580 nm or longer to 640 nm or shorter.

According to a fourth aspect of the present invention, in the ZnO-containing semiconductor layer of the first aspect, the emission peak wavelength is in a range of 520 nm or longer to 530 nm or shorter.

According to a fifth aspect of the present invention, there is provided a semiconductor light emitting device comprising: a first semiconductor layer of a first conductivity type; a second semiconductor layer of a second conductivity type opposite to the first conductivity type; an emission layer including a first ZnO-containing semiconductor layer and disposed between the first semiconductor layer and the second semiconductor layer; a first electrode electrically connected to the first semiconductor layer; and a second electrode electrically connected to the second semiconductor layer, wherein the first ZnO-containing semiconductor layer is a ZnO-containing semiconductor layer doped with Se, having an emission peak wavelength in visual light, and having a band gap equivalent to a band gap of ZnO.

According to a sixth aspect of the present invention, in the semiconductor light emitting device of the fifth aspect, the first ZnO-containing semiconductor layer is a ZnO-containing semiconductor layer selected from a group consisting of a ZnO-containing semiconductor layer doped with Se, having an emission peak wavelength in a range of 430 nm or longer to 490 nm or shorter, and having a band gap equivalent to a band gap of ZnO, a ZnO-containing semiconductor layer doped with Se, having an emission peak wavelength in a range of 580 nm or longer to 640 nm or shorter, and having a band gap equivalent to a band gap of ZnO, and a ZnO-containing semiconductor layer doped with Se, having an emission peak wavelength in a range of 520 nm or longer to 530 nm or shorter, and having a band gap equivalent to a band gap of ZnO.

According to a seventh aspect of the present invention, in the semiconductor light emitting device of the sixth aspect, the emission layer further includes a second ZnO-containing semiconductor layer, and the second ZnO-containing semiconductor layer is a ZnO-containing semiconductor layer selected from the group and having an emission peak wavelength different from the first ZnO-containing semiconductor layer.

By adding Se to ZnO under a proper film forming condition, a ZnO-containing semiconductor layer can be obtained which has a band gap equivalent to a band gap of ZnO and has an emission peak wavelength in visual light. Since the band gap of ZnO corresponds to an energy of ultraviolet light, the ZnO-containing semiconductor layer becomes emission material having high self transparency.

An emission peak wavelength of the ZnO-containing semiconductor layer can be set in a range of 430 nm or longer to 490 nm or shorter, in a range of 580 nm or longer to 640 nm or shorter, or in a range of 520 nm or longer to 530 nm or shorter.

By using the ZnO-containing semiconductor layer as an emission layer, a semiconductor light emitting device of various color emission can be obtained. If the emission layer is formed to display multi color emission, for example, white light can be obtained.

If the emission layer contains semiconductor layers of multi color emission and a band gap of each semiconductor layer is equivalent, it becomes possible, for example, to suppress the problem of different emission feasibility of each semiconductor layer to be caused by different band gaps.

DESCRIPTION OF THE PREFERRED EMBODIMENTS

Figure 1:
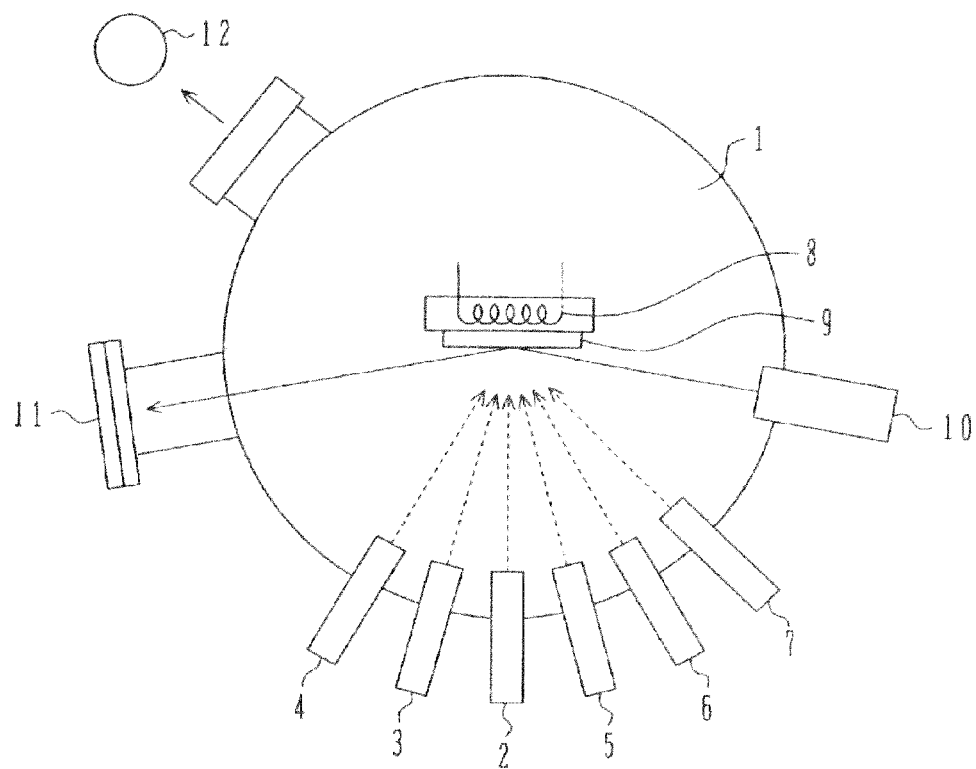
FIG. 1 is a schematic diagram illustrating an example of a film forming system for growing a ZnO-containing compound semiconductor layer.

First, with reference to FIG. 1, description will be made on an example of a film forming system (crystal manufacture system) for growing a zinc oxide (ZnO) containing compound semiconductor layer. As a film forming method, molecular beam epitaxy (MBE) is used.

A substrate heater 8 is disposed in an ultra high vacuum chamber 1, and a substrate 9 is held with the substrate heater 8. The substrate 9 may be a sapphire ($Al_2O_3$) substrate, a silicon carbide (SiC) substrate, a gallium nitride (GaN) substrate, a ZnO substrate or the like. In order to obtain a ZnO-containing compound semiconductor layer having good crystallinity, the smaller a lattice mismatch is, the better a substrate is. It is therefore best to use a ZnO substrate.

The ultra high vacuum chamber 1 is equipped with a zinc (Zn) source gun 2, an oxygen (O) source gun 3, a selenium (Se) source gun 4, a magnesium (Mg) source gun 5, a nitrogen (N) source gun 6 and a gallium (Ga) source gun 7.

The Zn source gun 2, Se source gun 4, Mg source gun 5 and Ga source gun 7 have Knudsen cells for accommodating solid sources of Zn, Se, Mg and Ga, respectively, and emit a Zn beam, an Se beam, an Mg beam and a Ga beam, respectively.

The O source gun 3 and N source gun 6 have electrodeless discharge tubes at a high frequency (e.g., 13.56 MHz). The O source gun 3 and N source gun 6 make radicals of oxygen gas and nitrogen gas in the electrodeless discharge tubes, and emit an O radical beam and an N radical beam.

As a desired beam is supplied to the substrate 9 at a desired timing, a ZnO-containing compound semiconductor layer having a desired composition can be grown.

A reflection high energy electron diffraction (RHEED) gun 10 and a screen 11 on which an RHEED image is displayed are mounted on the ultrahigh vacuum chamber 1. Crystallinity of a ZnO-containing compound semiconductor layer formed on the substrate 9 can be evaluated from an RHEED image. An exhaust pump 12 evacuates the inside of the ultra high vacuum chamber 1. An ultra high vacuum is a vacuum at a pressure of $1 \times 10^{-7}$ Torr or lower.

Next, description will be made on a growth method for a ZnO-containing semiconductor layer according to first to eighth embodiments. In the first to eighth embodiments, a c-plane ZnO substrate was used as a substrate, and a ZnO-containing semiconductor layer doped with Se (ZnO(Se) layer) was grown on the + c-plane (Zn plane). A ratio among a Zn beam flux amount, an O radical beam flux amount and an Se beam flux amount was changed for each embodiment.

First, description will be made on common processes to the growth methods of the first to eighth embodiments. First, a washed ZnO substrate was held with a substrate heater, and thermal annealing was performed to further clean the substrate surface. The thermal annealing was performed for 30 minutes at 900° C. at a high vacuum of $1 \times 10^{-9}$ Torr.

Next, a Zn beam, O radical beam and Se beam were applied at the same time to the + c-plane at a substrate temperature of 500° C. to form a ZnO(Se) layer. The Zn beam was applied by using a Zn solid source having a purity of 7N. The O radical beam was applied by introducing pure oxygen gas having a purity of 6N at 3 sccm and at a high frequency power of 300 W to form plasma. The Se beam was applied by using an Se solid source having a purity of 6N. In this manner, samples were manufactured by growing each ZnO(Se) layer to a thickness of about 1 μm.

The grown ZnO(e) layer was subjected to measurements of a photoluminescence (PL) spectrum, an Se concentration by secondary ion mass spectroscopy (SIMS), and a band gap. A PL spectrum was acquired by radiating He-Cd laser (2 mW) at a wavelength of 325 nm to the ZnO(Se) layer and measuring an emission spectrum obtained through spectroscopy of photoluminescence light with a photomultiplier tube. A band gap was obtained by calculating an absorption coefficient from measured transmissivity and reflectivity.

Next, description will be made on sample manufacturing conditions, PL spectra and Se concentrations of the first to eighth embodiments.

In the first embodiment, a Zn beam flux amount was set to $1\times10^{14}$ atoms/(cm$^2$s), an O radical beam flux amount was set to $1\times10^{15}$ atoms/(cm$^2$s), and an Se beam flux amount was set to $2\times10^{14}$ atoms/(cm$^2$s). A Zn/O beam flux ratio of the Zn beam flux amount to the O radical beam flux amount is 0.1, and an Se/O beam flux ratio of the Se beam flux amount to the O radical beam flux amount is 0.2.

Figure 2:
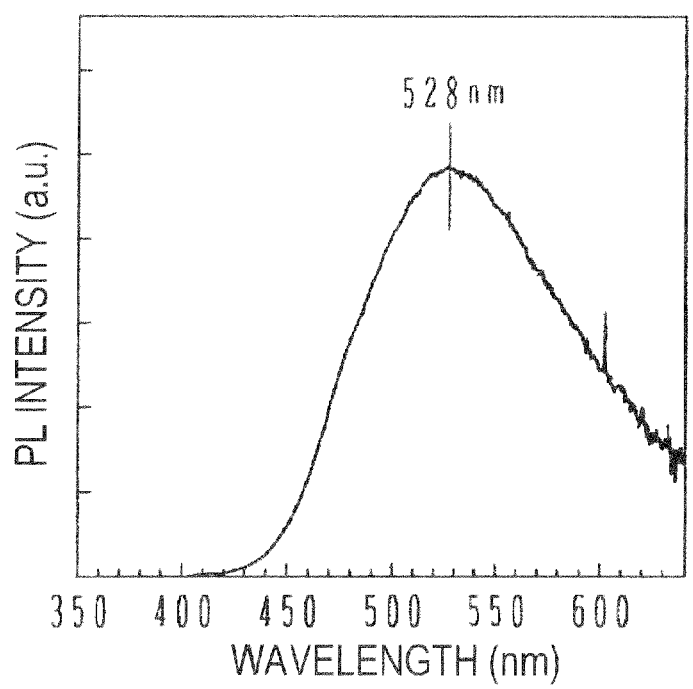
FIG. 2 illustrates a PL spectrum of a ZnO(Se) layer according to a first embodiment.

FIG. 2 illustrates a PL spectrum of the sample of the first embodiment. The abscissa of the graph represents a wavelength in the unit of nm, and the ordinate represents a PL intensity in an arbitrary scale (this is also applied to the graphs in FIGS. 3 to 9 corresponding to the second to eighth embodiments). A PL spectrum having an emission peak wavelength of 528 nm was obtained for the first embodiment. An Se concentration of the film was lower than $15\times10^{16}$ cm$^{-3}$ which is a lower detection limit of SIMS.

In the second embodiment, a Zn beam flux amount was set to $2\times10^{14}$ atoms/(cm$^2$s), an O radical beam flux amount was set to $1\times10^{15}$ atoms/(cm$^2$s), and an Se beam flux amount was set to $2\times10^{14}$ atoms/(Cm$^2$s). A Zn/O beam flux ratio is 0.2, and an Se/O beam flux ratio is 0.2.

Figure 3:
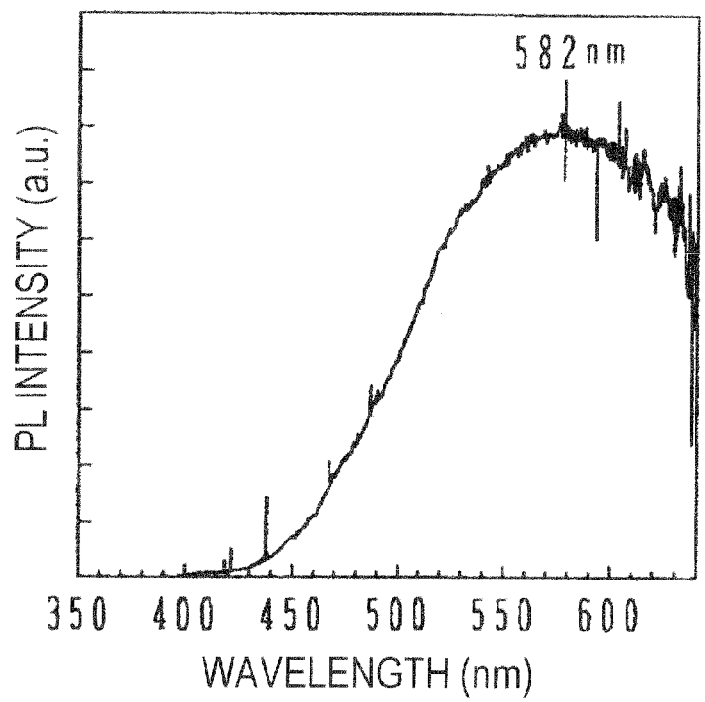
FIG. 3 illustrates a PL spectrum of a ZnO(Se) layer according to a second embodiment.

FIG. 3 illustrates a PL spectrum of the sample of the second embodiment. A PL spectrum having an emission peak wavelength of 582 nm was obtained for the second embodiment. An Se concentration of the film was $5\times10^{16}$ cm$^{-3}$.

In the third embodiment, a Zn beam flux amount was set to $7\times10^{14}$ atoms/(cm$^2$s), an O radical beam flux amount was set to $1\times10^{15}$ atoms/(cm$^2$s), and an Se beam flux amount was set to $2\times10^{14}$ atoms/(cm$^2$s). A Zn/O beam flux ratio is 0.7, and an Se/O beam flux ratio is 0.2.

Figure 4:
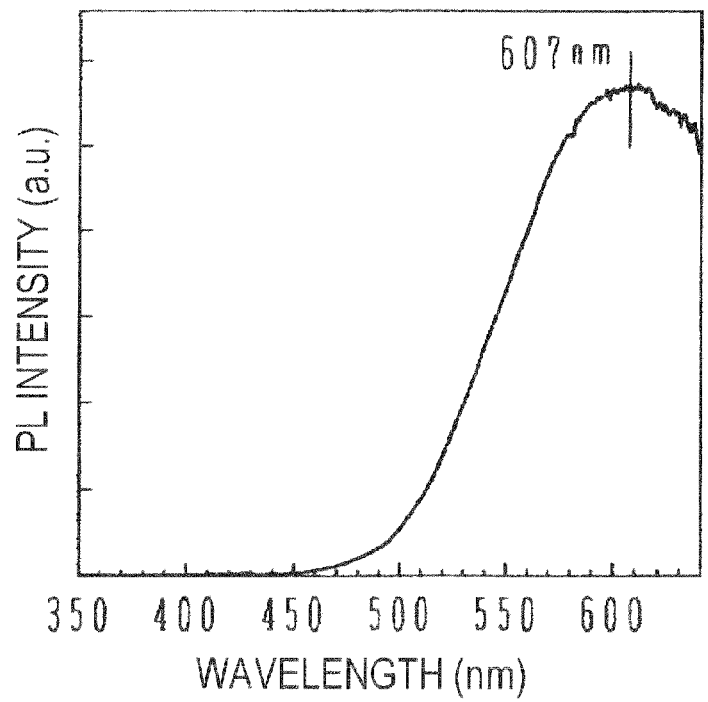
FIG. 4 illustrates a PL spectrum of a ZnO(Se) layer according to a third embodiment.

FIG. 4 illustrates a PL spectrum of the sample of the third embodiment. A PL spectrum having an emission peak wavelength of 607 nm was obtained for the third embodiment. An Se concentration of the film was $1\times10^{17}$ cm$^{-3}$.

In the fourth embodiment, a Zn beam flux amount was set to $2\times10^{15}$ atoms/(cm$^2$s), an O radical beam flux amount was set to $1\times10^{15}$ atoms/(cm$^2$s), and an Se beam flux amount was set to $2\times10^{13}$ atoms/(cm$^2$s). A Zn/O beam flux ratio is 2, and an Se/O beam flux ratio is 0.02.

Figure 5:
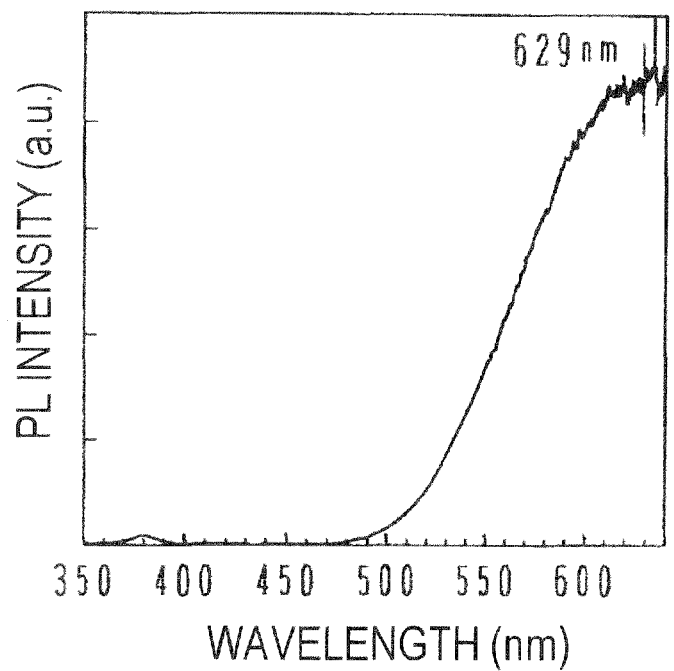
FIG. 5 illustrates a PL spectrum of a ZnO(Se) layer according to a fourth embodiment.

FIG. 5 illustrates a PL spectrum of the sample of the fourth embodiment. A PL spectrum having an emission peak wavelength of 629 nm was obtained for the fourth embodiment. An Se concentration of the film was $4.9\times10^{20}$ cm$^{-3}$.

In the fifth embodiment, a Zn beam flux amount was set to $1\times10^{14}$ atoms/(cm$^2$s), an O radical beam flux amount was set to $1\times10^{15}$ atoms/(cm$^2$s), and an Se beam flux amount was set to $4\times10^{11}$ atoms/(cm$^2$s) A Zn/O beam flux ratio is 0.1, and an Se/O beam flux ratio is 0.0004.

Figure 6:
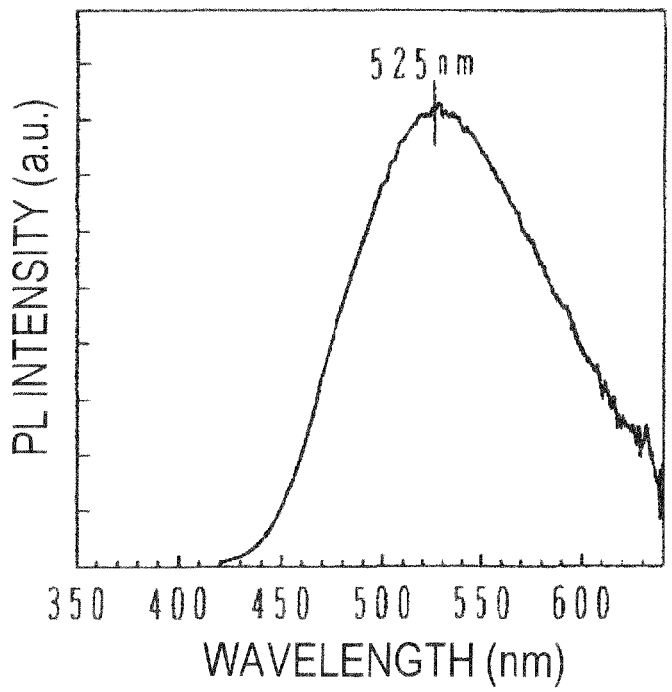
FIG. 6 illustrates a PL spectrum of a ZnO(Se) layer according to a fifth embodiment.

FIG. 6 illustrates a PL spectrum of the sample of the fifth embodiment. A PL spectrum having an emission peak wavelength of 525 nm was obtained for the fifth embodiment. An Se concentration of the film was smaller than $1.5\times10^{16}$ cm$^{-3}$ which is a lower detection limit of SIMS.

In the sixth embodiment, a Zn beam flux amount was set to $2\times10^{14}$ atoms/(cm$^2$s), an O radical beam flux amount was set to $1\times10^{15}$ atoms/(cm$^2$s), and an Se beam flux amount was set to $4\times10^{11}$ atoms/(cm$^2$s). A Zn/O beam flux ratio is 0.2, and an Se/O beam flux ratio is 0.0004.

Figure 7:
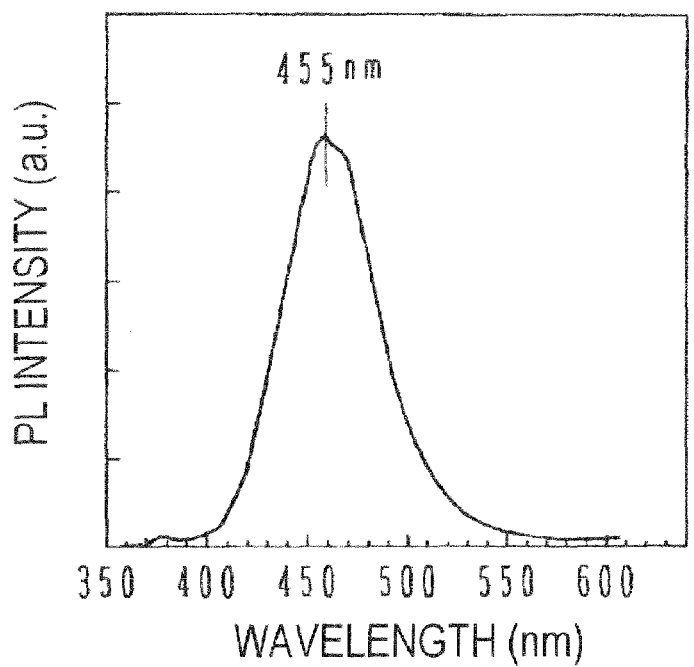
FIG. 7 illustrates a PL spectrum of a ZnO(Se) layer according to a sixth embodiment.

FIG. 7 illustrates a PL spectrum of the sample of the sixth embodiment. A PL spectrum having an emission peak wavelength of 455 nm was obtained for the sixth embodiment. An Se concentration of the film was $5\times10^{20}$ cm$^{-3}$.

In the seventh embodiment, a Zn beam flux amount was set to $2\times10^{15}$ atoms/(cm$^2$s), an O radical beam flux amount was set to $1\times10^{15}$ atoms/(cm$^2$s), and an Se beam flux amount was set to $4\times10^{11}$ atoms/(cm$^2$s). A Zn/O beam flux ratio is 2, and an Se/O beam flux ratio is 0.0004.

Figure 8:
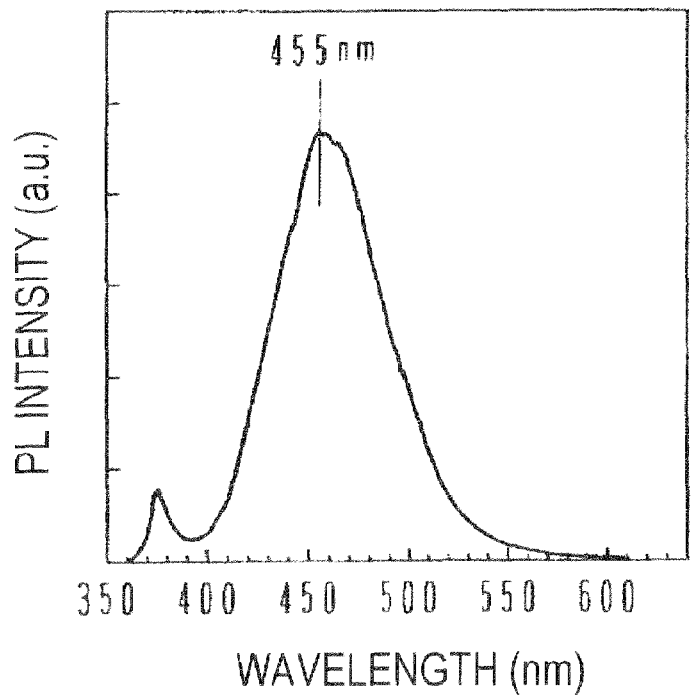
FIG. 8 illustrates a PL spectrum of a ZnO(Se) layer according to a seventh embodiment.

FIG. 8 illustrates a PL spectrum of the sample of the seventh embodiment. A PL spectrum having an emission peak wavelength of 455 nm was obtained for the seventh embodiment. An Se concentration of the film was $4\times10^{19}$ cm$^{-3}$.

In the PL spectrum of the seventh embodiment, although a low peak having a peak wavelength of about 370 nm corresponding to a band gap of ZnO is observed, the peak wavelength of the main peak (peak wavelength having a maximum intensity) is used as the emission peak wavelength.

In the eighth embodiment, a Zn beam flux amount was set to $2\times10^{15}$ atoms/(cm$^2$s), an O radical beam flux amount was set to $1\times10^{15}$ atoms/(cm$^2$s), and an Se beam flux amount was set to $2\times10^{10}$ atoms/(cm$^2$s). A Zn/O beam flux ratio is 2, and an Se/O beam flux ratio is 0.00002.

Figure 9:
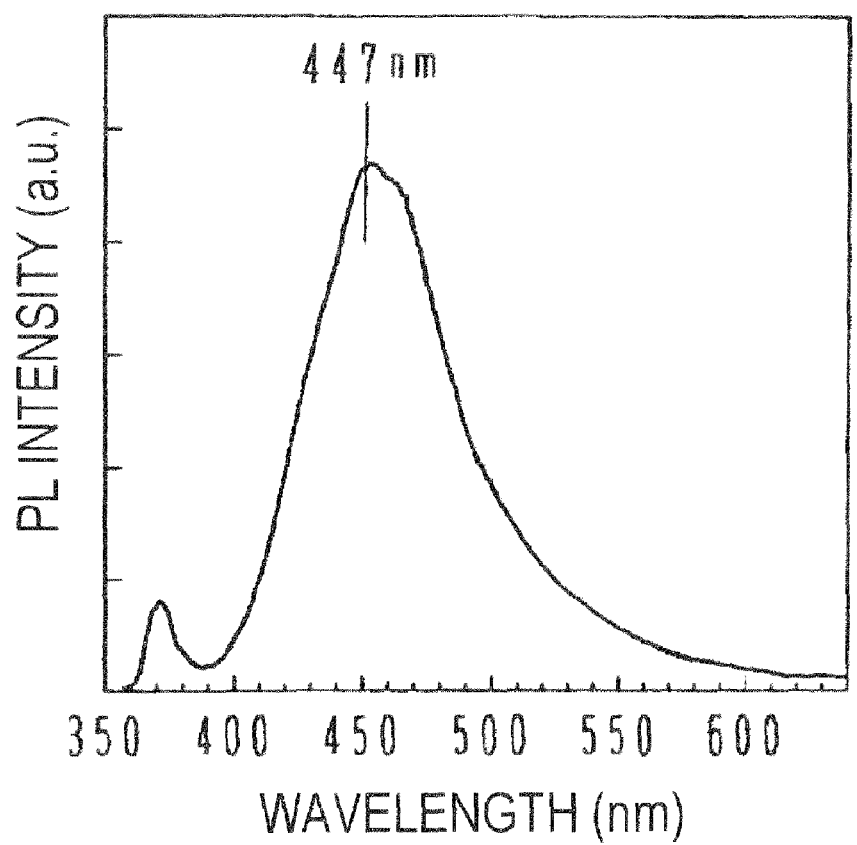
FIG. 9 illustrates a PL spectrum of a ZnO(Se) layer according to an eighth embodiment.

FIG. 9 illustrates a PL spectrum of the sample of the eighth embodiment. A PL spectrum having an emission peak wavelength of 447 nm was obtained for the eighth embodiment. An Se concentration of the film was $4\times10^{17}$ cm$^{-3}$.

In addition to the samples of the above-described embodiments, other samples of the ZnO(Se) layer were manufactured under various conditions, and the PL spectra and the like were measured. It has been found from the measurement results that an emission peak wavelength and the like of the ZnO(Se) layer can be controlled by controlling the Zn/O beam flux ratio and Se/O beam flux ratio, as described in the following.

Figure 10:
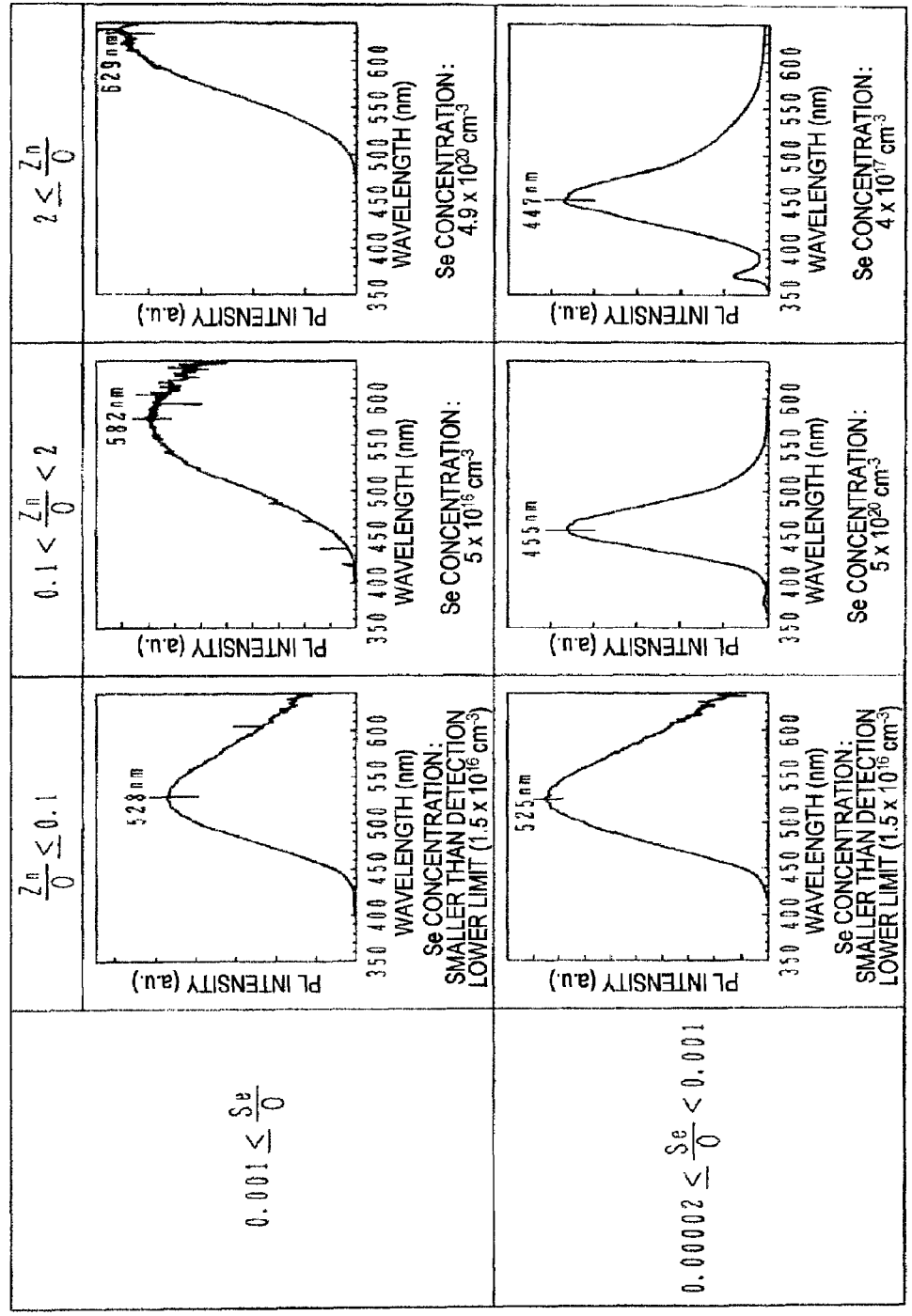
FIG. 10 is a table illustrating examples of a PL spectrum and an Se concentration of a ZnO(Se) layer under each condition of a Zn/O beam flux ratio and an Se/O beam flux ratio.

FIG. 10 is a table illustrating examples of a PL spectrum and an Se concentration of a ZnO(Se) layer under each condition of a Zn/O beam flux ratio and an Se/O beam flux ratio.

A Zn/O beam flux ratio (hereinafter simply represented by Zn/O) is classified into three ranges: Zn/O≦0.1, 0.1<Zn/O<2, and 2≦Zn/O. An Se/O beam flux ratio (hereinafter simply represented by Se/O) is classified into two ranges: 0.00002≦Se/O<0.001, and 0.001≦Se/O.

The PL spectrum and Se concentration of a Zn/O(Se) film under each condition are only illustrative examples For the range of 0.00002≦Se/O<0.001, the result of the fifth embodiment is illustrated for the range of Zn/O≦0.1, the result of the sixth embodiment is illustrated for the range of 0.1<Zn/O<2, and the result of the eighth embodiment is illustrated for the range of 2≦Zn/O. For the range of 0.001≦Se/O, the result of the first embodiment is illustrated for the range of Zn/O≦0.1, the result of the second embodiment is illustrated for the range of 0.1<Zn/O<2, and the result of the fourth embodiment is illustrated for the range of 2≦Zn/O.

A ZnO(Se) layer grown under the conditions of 0.00002≦Se/O<0.001, and 0.1<Zn/O has a blue emission peak wavelength of, e.g., near 450 nm, and provides a PL spectrum having a half value width of about 55 nm. An Se concentration of the ZnO(Se) grown under these conditions is about $4\times10^{17}$ cm$^{-3}$ to $5\times10^{20}$ cm$^{-3}$.

A PL spectrum of a ZnO(Se) layer manufactured under the conditions same as those of, for example, the sixth embodiment, changes its peak wavelength from 455 nm to 490 nm as an energizing intensity is changed from 2.0 mA to 0.005 mA. The ZnO(Se) layer grown under the conditions of 0.00002≦Se/O<0.001 and 0.1<Zn/O demonstrates blue emission having an emission peak wavelength width of about several tens nm. It can be considered that by growing a ZnO(Se) layer under the conditions of 0.00002≦Se/O<0.001 and 0.1<Zn/O, a blue emission peak wavelength in a range of 430 nm or longer to 490 nm or shorter is obtained.

A ZnO(Se) layer grown under the conditions of 0.001≦Se/O and 0.1<Zn/O provides a PL spectrum having an orange emission peak wavelength in a range of 580 nm or longer to 640 nm or shorter. An Se concentration of the ZnO(Se) grown under these conditions is about $5\times10^{16}$ cm$^{-3}$ to $5\times10^{20}$ cm$^{-3}$. As the Se concentration increases, the emission peak wavelength shifts to the longer wavelength side. For example, a PL spectrum having an emission peak wavelength near at 610 nm has a half value width of about 120 nm. The ZnO(Se) layer of orange emission does not change its peak wavelength with an energizing intensity.

A ZnO(Se) layer grown under the conditions of ($0.00002 \leq$Se/O$<0.001$ or $0.001\leq$Se/O) and $0.1\geq$Zn/O has a green emission peak wavelength (e.g., 525 nm) in a wavelength range of 520 nm or longer to 530 nm or shorter, and provides a PL spectrum having a half value width of about 120 nm. An Se concentration of the ZnO(Se) grown under these conditions is smaller than $1.5\times10^{16}$ cm$^{-3}$ which is smaller than a lower detection limit of SIMS. The ZnO(Se) layer of green emission also does not change its peak wavelength with an energizing intensity.

The tendencies described above are likely to be obtained if a substrate temperature during film formation is in a range of 300° C. or higher to 800° C. or lower. If a film forming temperature is too low, crystallinity of a grown film is degraded so that an emission intensity lowers. If a film forming temperature is too high, Se is not captured in the film so that desired emission color cannot be obtained. A substrate temperature during film formation is preferably set particularly in a range of 400° C. or higher to 600° C. or lower.

Next, a band gap of a ZnO(Se) layer will be described. As described above, a band gap is derived by calculating an absorption coefficient from measured transmissivity and reflectivity. A band gap can be evaluated from a relation of $\alpha \propto (h\nu-E_g)^{1/2}$ where $\alpha$ is an absorption coefficient, hv is a photon energy and $E_g$ is a band gap.

Figure 11:
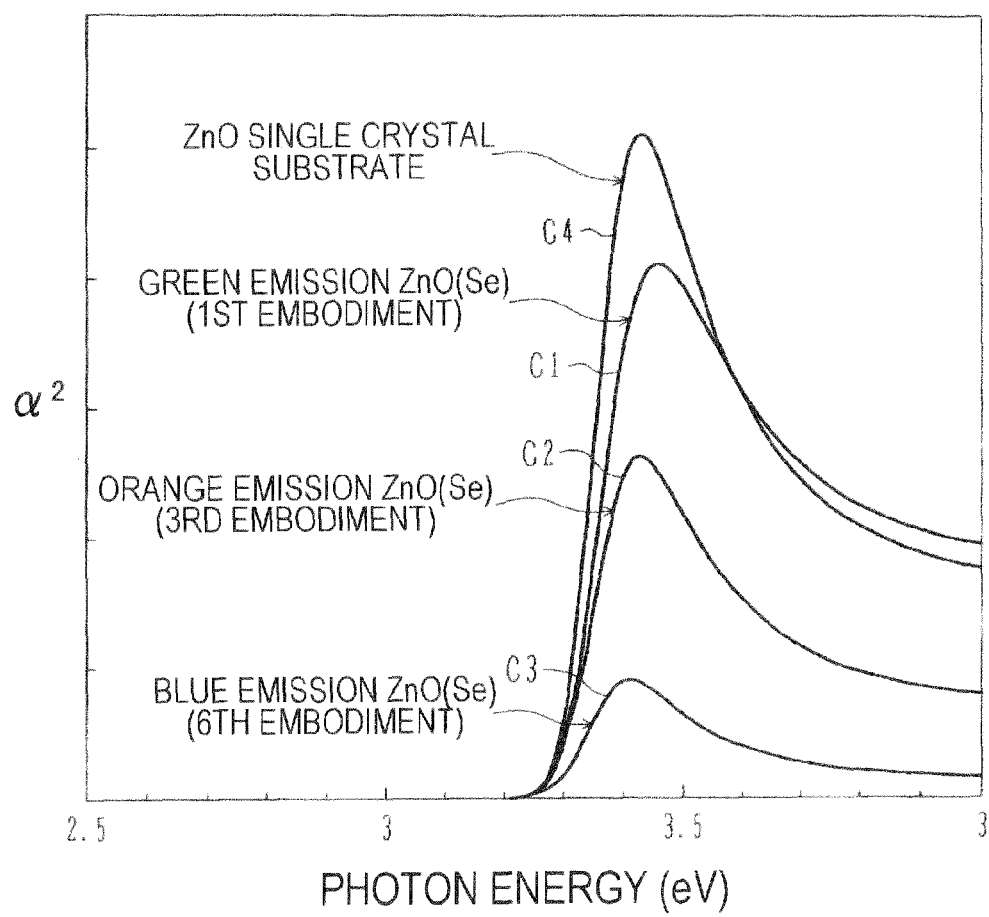
FIG. 11 is a graph illustrating a photon energy dependency of a square of an absorption coefficient α of the ZnO(Se) layers of the first, third and sixth embodiments and a ZnO single crystal substrate.

FIG. 11 is a graph illustrating a photon energy dependency of a square $\alpha^2$ of an absorption coefficient of the ZnO(Se) layer of the first embodiment of green emission, ZnO(Se) layer of the third embodiment of orange emission, and ZnO (Se) layer of the sixth embodiment of blue emission.

The abscissa represents a photon energy in the unit of eV, and the ordinate represents $\alpha^2$. Curves C1 to C4 indicate absorption coefficients of the first embodiment (green), third embodiment (orange), sixth embodiment (blue) and ZnO single crystal substrate, respectively.

A band gap can be estimated from a cross point between a photon energy axis and a straight line fitting a linearly increasing portion in a portion from a rise to a peak of each $\alpha^2$ graph.

A band gap of a ZnO single crystal substrate is 3.3 eV, and the ZnO(Se) layer of any emission color has a band gap equivalent to that of the ZnO single crystal substrate A band gap equivalent to that of ZnO is intended to mean a difference from a band gap (3.3 eV) of ZnO is 0.1 eV or smaller.

As described above, a ZnO(Se) layer of blue emission can be obtained through film formation under the conditions of $0.00002\leq$Se/O$<0.001$ and $0.1<$Zn/O, a ZnO(Se) layer of orange emission can be obtained through film formation under the conditions of $0.001\leq$Se/O and $0.1<$Zn/O, and a ZnO(Se) layer of green emission can be obtained through film formation under the conditions of Zn/O$\leq0.1$. A band gap of the ZnO(Se) layer of any emission color has a value equivalent to that of ZnO.

Upper limits of Se/O and Zn/O and a lower limit of Zn/O are estimated in the following manner. The specification of the film forming system used for the embodiments allows the flux amounts of the Zn beam and Se beam to be controlled stably in a range of about $1\times10^{10}$ to $1\times10^{17}$ atoms/(cm$^2$s). A flux amount of the oxygen radical beam can be controlled stably in a range of about $1\times10^{13}$ to $1\times10^{16}$ atoms/(Cm$^2$s).

The upper limits of the flux ratios of Se/O and Zn/O are therefore estimated as $1\times10^4$, and the low limit of Zn/O is estimated as $1\times10^{-6}$. These values are however values restricted by the system specification. For example, if source guns capable of controlling the flux amounts of high density Zn and Se beams are used, and if an RF radical gun capable of controlling a wide range of oxygen radical amounts is used, there is a possibility that the upper limits of Se/O and Zn/O are set larger than $1\times10^4$, and the lower limit of Zn/O is set to $1\times10^{-6}$ or smaller.

It can be considered that the above-described ZnO(Se) layer can be used as an emission layer of a semiconductor light emitting device. Next, a semiconductor light emitting device manufacture method of a ninth embodiment will be described. In the ninth embodiment, a single color semiconductor light emitting device is manufactured using as an emission layer a ZnO(Se) layer of one color layer among the ZnO(Se) layers of blue emission, green emission and orange emission described above.

Figure 12A:
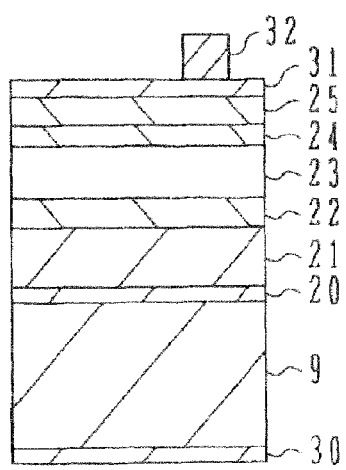
FIG. 12A is a schematic cross sectional view illustrating a light emitting device according to a ninth embodiment.

FIG. 12A is a schematic cross sectional view of a light emitting device of the ninth embodiment. A c-plane ZnO substrate having an n-type conductivity is used as a substrate 9, and a light emitting device is formed on the +c-plane. First, the substrate 9 is held with a substrate heater of a film forming system, and thermal annealing is performed for 30 minutes at 900° C. to further clean the substrate surface.

Next, an n-type ZnO buffer layer 20 is formed on the substrate 9 subjected to thermal annealing The n-type ZnO buffer layer 20 can be formed by growing an n-type ZnO buffer layer by applying a Zn beam and an O radical beam at the same time to the substrate heated to 300° C. to 500° C. and performing annealing for about 30 minutes at 800° C. to 900° C. A thickness of the n-type ZnO buffer layer 20 is preferably about 10 nm to 30 nm. It can be considered that this annealing removes 0 atoms from the n-type ZnO buffer layer 20 to form an n-type of conductivity.

Next, a Ga doped n-type ZnO layer 21 is formed on the n-type ZnO buffer layer 20. The n-type ZnO layer 21 is grown by applying a Zn beam, an O radical beam and a Ga beam at the same time to the substrate heated to 500° C. to 1000° C. A thickness of the n-type ZnO layer 21 is preferably set to 1 µm to 2 µm, and a Ga concentration is preferably set to $1\times10^{18}$ cm$^{-3}$ or larger.

Next, a Ga doped n-type Mg$_x$Zn$_{1-x}$O(0<x<1: e.g., 0.25) layer 22 is formed on the n-type ZnO layer 21. The n-type Mg$_x$Zn$_{1-x}$O layer 22 is grown by applying a Zn beam, an O radical beam, an Mg beam and a Ga beam at the same time to the substrate having a substrate temperature lower than that when the n-type ZnO buffer layer 20 was grown. A thickness of the n-type Mg$_x$Zn$_{1-x}$O layer 22 is preferably set to 100 nm to 600 nm, and a Ga concentration is preferably set to $1\times10^{18}$ cm$^{-3}$ or larger.

Next, an emission layer 23 is formed on the n-type Mg$_x$Zn$_{1-x}$O layer 22. The emission layer 23 has a quantum well structure having a ZnO(Se) layer as a well layer and an Mg$_x$Zn$_{1-x}$O(0<x<1: e.g., 0.2) layer as a barrier layer.

Figure 12B:
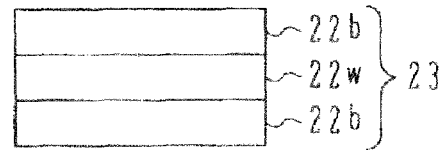
FIGS. 12B and 12C are schematic cross sectional views illustrating an example of the structure of an emission layer.
Figure 12C:
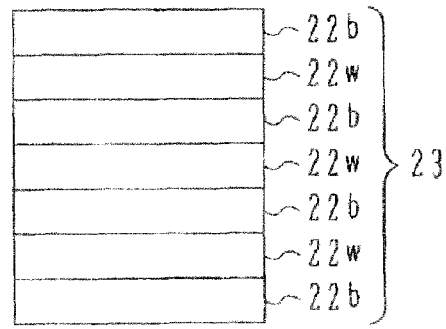

For example, as illustrated in FIG. 12B, the emission layer 23 is formed by forming one cycle of a lamination structure of a ZnO(Se) well layer 23w stacked on an Mg$_x$Zn$_{1-x}$O barrier layer and forming an Mg$_x$Zn$_{1-x}$O barrier layer 23b as the uppermost layer. The emission layer 23 may have a multiple quantum well structure by forming the above-described lamination structure a plurality of cycles, for example, as illustrated in FIG. 12C.

The emission layer 23 is grown at a substrate temperature of 300° C. to 800° C. The ZnO(Se) well layer 23w is grown by applying a Zn beam, an O radical beam and an Se beam at the same time. A thickness of the ZnO(Se) well layer 23w is desired to be about 0.5 nm to 20 nm. By controlling the Zn/O beam flux ratio and Se/O beam flux ratio as described earlier, an emission peak wavelength of the emission layer 23 can be adjusted.

The $Mg_xZn_{1-x}O$ barrier layer 23b is grown by applying a Zn beam, an O radical beam and an Mg beam at the same time. A thickness of the $Mg_xZn_{1-x}O$ barrier layer 23b is desired to be about 5 nm to 20 nm.

Next, an N doped p-type $Mg_xZn_{1-x}O$ (0<x<1: e.g., 0.25) layer 24 is formed on the emission layer 23. The p-type ZnO layer 24 is grown by applying a Zn beam, an O radical beam, an Mg beam and an N radical beam at the same time to the substrate heated to 500° C. to 1000° C. A thickness of the p-type ZnO layer 24 is preferably set to 100 nm to 300 nm, and an N concentration is preferably set to $1\times10^{18}$ cm$^{-3}$ or larger. The p-type $Mg_xZn_{1-x}O$ layer uniformly doped with N in the layer can be obtained.

Next, an N doped p-type ZnO layer 25 is formed on the p-type $Mg_xZn_{1-x}O$ layer 24. The p-type ZnO layer 25 is grown by applying a Zn beam, an O radical beam, and an N radical beam at the same time to the substrate heated to 500° C. to 1000° C. A thickness of the p-type ZnO layer 25 is preferably set to 100 nm to 200 nm, and an N concentration is preferably set to $1\times10^{19}$ cm$^{-3}$ or larger he p-type ZnO layer uniformly doped with N in the layer can be obtained.

Next, electrodes are formed. An n-side electrode 30 is formed on a lower surface of the substrate 9. The n-side electrode 30 is formed, for example, by forming a Ti layer having a thickness of 2 nm to 10 nm on the lower surface of the substrate 9 and stacking an Al layer having a thickness of 300 nm to 500 nm upon the Ti layer.

A p-side electrode 31 is formed on an upper surface of the p-type ZnO layer 25. The p-side electrode 31 is formed, for example, by forming an Ni layer having a thickness of 0.5 nm to 1 nm on the upper surface of the p-type ZnO layer 25 and stacking an Au layer having a thickness of 10 nm upon the Ni layer. A bonding electrode 32 is formed on the p-side electrode 31. The bonding electrode 32 is made of, e.g., an Au layer having a thickness of 500 nm.

After these electrodes are formed, an electrode alloying process is performed in an oxygen atmosphere, e.g., at 400° C. to 800° C. An alloying process time is, e.g., one minute to 10 minutes. A light emitting device of the ninth embodiment is thus manufactured. A light emitting device of single color can be obtained providing blue emission, green emission or orange emission. The quantum well structure has a possibility that an emission wavelength shifts slightly from the case of only the emission layer. However, this shift degree is expected not to change emission color.

The n-type $Mg_xZn_{1-x}O$ layer 22 disposed under the emission layer 23 may be omitted. Both the n-type $Mg_xZn_{1-x}O$ layer 22 and p-type $Mg_xZn_{1-x}O$ layer 24 disposed under and above the emission layer 23 may be omitted.

The emission layer 23 may be a single ZnO(Se) layer. Namely, a light emitting device having a double hetero (DH) structure may be formed in which a ZnO(Se) layer is sandwiched between the clad layers of the n-type $Mg_xZn_{1-x}O$ layer 22 and p-type $Mg_xZn_{1-x}O$ layer 24. A thickness of the ZnO(se) is desired to be about 100 nm to 2 μm. A growth temperature is set to 300° C. to 800° C.

The n-type $Mg_xZn_{1-x}O$ layer 22 disposed under a single ZnO(Se) emission layer 23 may be omitted to form a single hetero (SH) structure.

Although the ZnO substrate having an n-type of conductivity is used as the substrate 9, an SiC substrate or a GaN substrate having an n-type of conductivity may also be used.

Next, a semiconductor light emitting device manufacture method of a tenth embodiment will be described. Different points from the ninth embodiment reside in that an insulating sapphire substrate 9a is used as a substrate, and because of this a different electrode forming process is incorporated.

Figure 13:
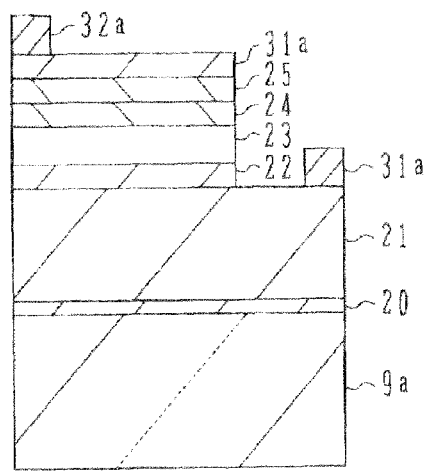
FIG. 13 is a schematic cross sectional view illustrating a light emitting device according to a tenth embodiment.

FIG. 13 is a schematic cross sectional view of a light emitting device of the tenth embodiment. Similar to the ninth embodiment, layers from the n-type ZnO buffer layer 20 and to the p-type ZnO layer 25 are formed on and above the substrate 9a. A wafer formed with the layers up to the p-type ZnO layer 25 is picked up from a film forming system, and thereafter a resist film, a protective film or the like is formed on the p-type ZnO layer 25 and patterned to form an etching mask having a recess window corresponding to an area where an n-side electrode is to be formed. By using this etching mask, the layers from the p-type ZnO layer 25 to the n-type $Mg_xZn_{1-x}O$ layer 22 are etched, for example, by wet etching, or reactive etching, to expose the n-type ZnO layer 21.

Next, for example, a Ti layer having a thickness of 2 nm to 10 nm is formed on the exposed surface of the ntype ZnO layer 21, and an Al layer having a thickness of 300 nm to 500 nm is stacked upon the Ti layer to form an n-side electrode 30a. After the n-side electrode 30a is formed, the etching mask is removed.

Next, for example, an Ni layer having a thickness of 0.5 nm to 1 nm is formed on the surface of the p-type ZnO layer 25, and an Au layer having a thickness of 10 nm is stacked upon the Ni layer to form a p-side electrode 31a. A bonding electrode 32a made of, e.g., an Au layer having a thickness of 500 nm is formed on the p-side electrode 31a. The p-side electrode 31a and bonding electrode 32a are formed by using a proper mask so as not to deposit material of the p-side electrodes on the n-side electrode 30a.

After these electrodes are formed, an electrode alloying process is executed, for example, in an oxygen atmosphere at 400° C. to 800° C., similar to the ninth embodiment. An alloying process time is, e.g., one minute to ten minutes. In this manner, a light emitting device of the tenth embodiment is manufactured.

An insulating sapphire substrate can be used as a substrate of the light emitting device of the tenth embodiment. A ZnO substrate, an SiC substrate or a GaN substrate may also be used.

Next, a semiconductor light emitting device manufacture method of an eleventh embodiment will be describe. In the eleventh embodiment, a multi color light emitting device is manufactured by using three-color ZnO(Se) layers of blue emission, green emission and orange emission described previously. Structures other than an emission layer 23 are similar to those of the light emitting device of the ninth or tenth embodiment.

Figure 14:
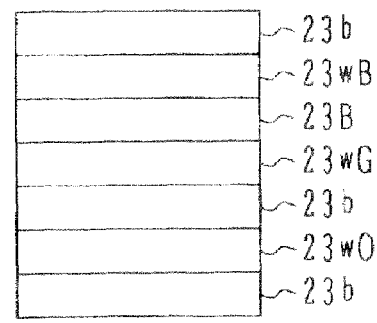
FIG. 14 is a schematic cross sectional view illustrating an emission layer of a light emitting device according to an eleventh embodiment.

FIG. 14 is a schematic cross sectional view of the emission layer 23 of the light emitting device of the eleventh embodiment. The emission layer 23 of the light emitting device of the eleventh embodiment has a multi quantum well structure including three well layers: a ZnO(Se) well layer 23wO corresponding to orange emission, a ZnO(Se) well layer 23wG corresponding to green emission, and a ZnO(Se) well layer 23wB corresponding to blue emission. An $Mg_xZn_{1-x}O$ barrier layer 23b is similar to the barrier layer of the light emitting device of the ninth or tenth embodiment.

Each well layer is formed by controlling a Zn/O beam flux ratio and an Se/O beam flux ratio to obtain desired color emission. The ZnO(Se) well layer 23wO, ZnO(Se) well layer 23wG, and ZnO(Se) well layer 23wB can be manufactured under the conditions of Zn/O beam flux ratios and Se/O beam flux ratios of, e.g., the third embodiment, first embodiment and sixth embodiment, respectively.

Since the light emitting device of the eleventh embodiment can emit three colors of blue, green and orange, white light can be obtained. An emission intensity of each color can be adjusted, for example, by adjusting a thickness of each well layer.

Figure 15A:
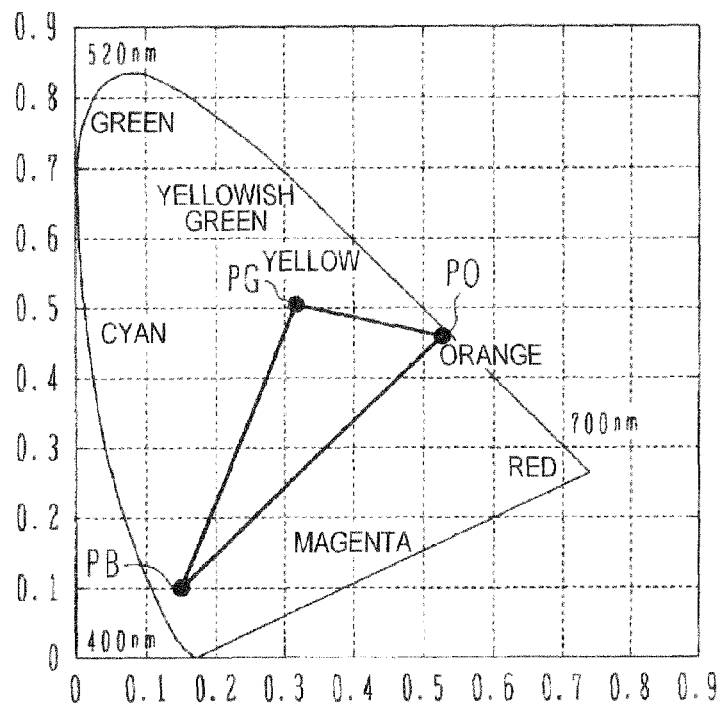
FIGS. 15A and 15B illustrate chromaticity diagrams.

FIG. 15A illustrates a chromaticity diagram. Points PB, PG and PO indicate chromaticity coordinates of emission from a blue emission portion, a green emission portion and an orange emission portion of the emission layers. By using the light emitting device of the eleventh embodiment, it becomes possible to display color emission in an area surrounded by straight lines interconnecting the points PB, PG and PO.

Figure 15B:
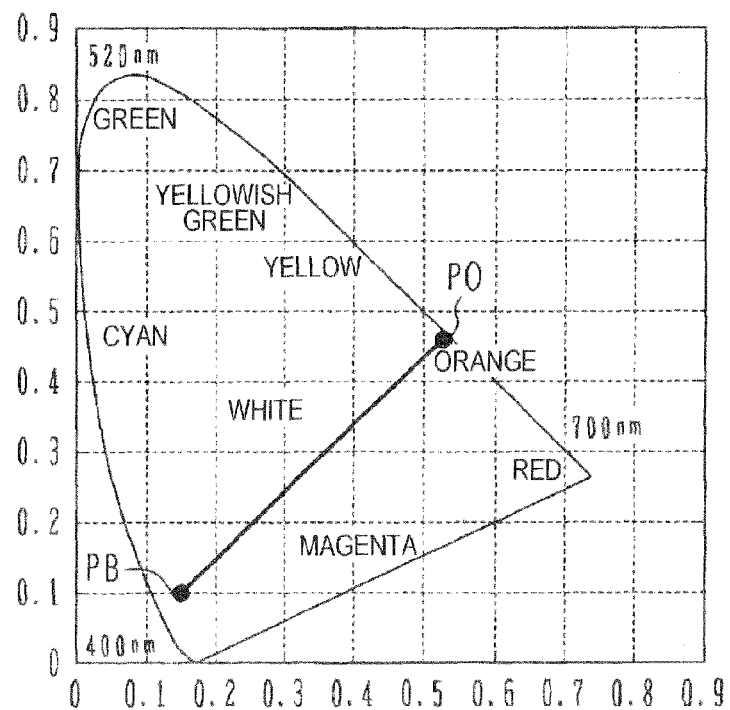

Although the light emitting device emitting all three colors has been described, it is possible to manufacture a light emitting device emitting only two colors. For example, a light emitting device emitting blue and orange colors can display color emission on a straight line interconnecting points PB and PO in the chromaticity diagram illustrated in FIG. 15B. White color emission can be obtained even by this light emitting device.

Although one well layer is formed for each color emission in the above description, a plurality of well layers may be formed for each color emission. By adjusting the number of well layers for each color emission, it is expected that an intensity of each color emission can be adjusted.

As described above, with the embodiment methods, a ZnO (Se) layer can be obtained having an emission peak wavelength in visual light. ZnO(Se) layers of blue emission, green emission and orange emission can be selectively manufactured in accordance with the film forming conditions.

The ZnO(Se) layer of any color emission has a band gap equivalent to that of ZnO. A band gap of ZnO has an energy corresponding to ultraviolet light. Therefore, a ZnO(Se) layer formed by the embodiment method has excellent self transparency.

Consider now a multi color light emitting device using a well layer having color emission corresponding to a band gap. For example, the light emitting device has well layers of three-color emission of blue, green and orange. Such a multi color light emitting device has a tendency that the well layer having the narrowest band gap is likely to emit. Further, there is a fear that emission from a well layer having the widest band gap (e.g., a well layer of blue emission) is absorbed by a well layer having the narrowest band gap (e.g., a well layer of orange emission). Because of these factors, it is difficult to adjust an intensity of each color emission of such a multi color light emitting device.

In the multi color light emitting device of the embodiment, a band gap of the well layer of any color emission is equivalent to that of ZnO (a difference from the band gap of ZnO is 0.1 eV or smaller) so that a difference of emission feasibility to be caused by a band gap difference is hard to occur. A band gap of any well layer has an energy corresponding to ultraviolet light and is wider than an energy corresponding to color emission in visual light. It is therefore possible to suppress the problem that emission at a shorter wavelength is absorbed by a well layer of longer wavelength emission. Therefore, the multi-color light emitting device of the embodiment facilitates intensity adjustment of each color emission. An intensity of each color emission of the multi color light emitting device of the embodiment can be adjusted by changing at least one of a well layer thickness and the number of well layers.

In the above-described embodiments, although a c-plane ZnO substrate is used and a semiconductor device is formed on the +c-plane, a semiconductor device may be formed on a −c-plane. A semiconductor device may be formed on a ZnO substrate having an a-plane or an m-plane.

Figure 16A:
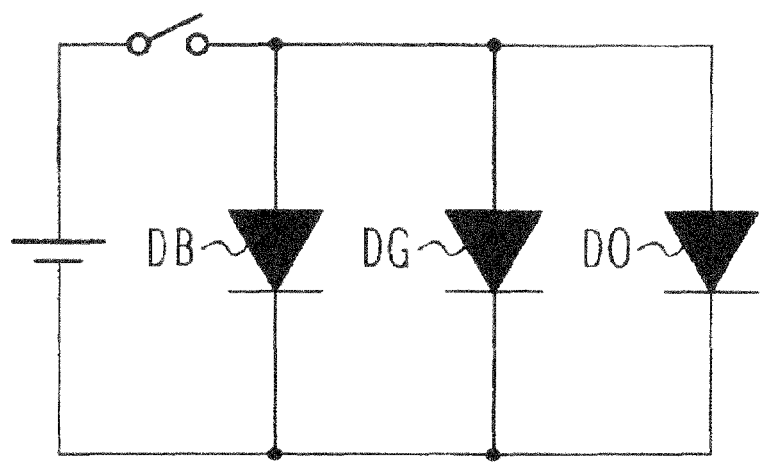
FIGS. 16A and 16B illustrate brief circuit diagrams of a light emitting apparatus according to a twelfth embodiment and its modification.

Next, description will be made on light emitting apparatus according to a twelfth embodiment and its modification. As illustrated in FIG. 16A, a light emitting apparatus of the twelfth embodiment displays white light by turning on at the same time three-color light emitting devices DB, DG and DO of blue, green and orange. Since the three-color light emitting devices DB, DG and DO can be made of materials having the same band gap, it is easy to properly operate all the light emitting devices at the same application voltage.

Figure 16B:
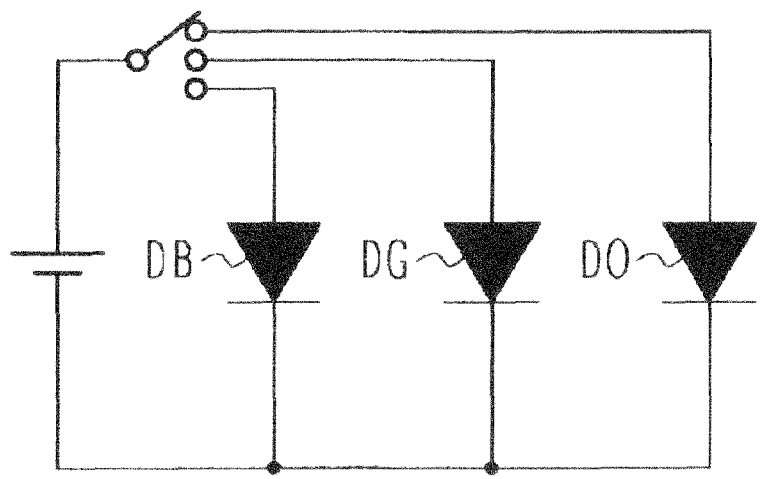

As illustrated in FIG. 16B, a light emitting apparatus of the modification of the embodiment selectively turns on three-color light emitting devices DB, DG and DO of blue, green and orange. Since the three-color light emitting devices DB, DG and DO can be made of materials having the same band gap, it is easy to properly operate the light emitting device of any color emission at the same application voltage.

Although manufacturing a light emitting diode (LED) has been described above, a laser diode (LD) may also be manufactured by forming a cavity through cleavage. Products applying these light emitting devices may also be manufactured such as various indicators, LED displays, LD displays, illumination instruments, and back light for displays. It is possible to obtain color emission of blue, green, orange and white through mixture of blue, green and orange.

The present invention has been described above in connection with the embodiments. The present invention is not limited only to the embodiments. For example, it is apparent for those skilled in the art to make various modifications, improvements, combinations and the like.

What are claimed are:

1. A ZnO-containing semiconductor doped with Se, having an emission peak wavelength in visual light, and having a band gap equivalent to a band qap of ZnO,
    wherein said emission peak wavelength is in a range of 580 nm or longer to 640 nm or shorter.

2. A ZnO-containing semiconductor doped with Se, having an emission peak wavelength in visual light, and having a band gap equivalent to a band qap of ZnO,
    wherein said emission peak wavelength is in a range of 520 nm or longer to 530 nm or shorter.

3. A manufacture method for a ZnO-containing semiconductor layer, comprising steps of:
    (a) preparing a substrate; and
    (b) applying at a same time a Zn beam of a first beam flux amount, an O radical beam of a second beam flux amount and an Se beam of a third beam flux amount to said substrate, while conditions of $0.1<Zn/O$ and $0.00002 \leq Se/O < 0.001$ are satisfied where Zn/O is a ratio of said first beam flux amount to said second beam flux amount and Se/O is a ratio of said third beam flux amount to said second beam flux amount.

4. The manufacture method for a ZnO-containing semiconductor layer according to claim 3, wherein in said step (b) a temperature of said substrate is set to 300° C. or higher to 800° C. or lower.

5. A manufacture method for a ZnO-containing semiconductor layer, comprising steps of:
    (a) preparing a substrate; and
    (b) applying at a same time a Zn beam of a first beam flux amount, an O radical beam of a second beam flux amount and an Se beam of a third beam flux amount to said substrate, while conditions of $0.1<Zn/O$ and 0.001≦Se/O are satisfied where Zn/O is a ratio of said first beam flux amount to said second beam flux amount and Se/O is a ratio of said third beam flux amount to said second beam flux amount.

6. The manufacture method for a ZnO-containing semiconductor layer according to claim 5, wherein in said step (b) a temperature of said substrate is set to 300° C. or higher to 800° C. or lower.

7. A manufacture method for a ZnO-containing semiconductor layer, comprising steps of:
    (a) preparing a substrate; and
    (b) applying at a same time a Zn beam of a first beam flux amount, an O radical beam of a second beam flux amount and an Se beam of a third beam flux amount to said substrate, while a condition of Zn/O≦0.1 is satisfied where Zn/O is a ratio of said first beam flux amount to said second beam flux amount.

8. The manufacture method for a ZnO-containing semiconductor layer according to claim 7, wherein in said step (b) a temperature of said substrate is set to 300° C. or higher to 800° C. or lower.

9. A semiconductor light emitting device comprising:
    a first semiconductor layer of a first conductivity type;
    a second semiconductor layer of a second conductivity type opposite to said first conductivity type;
    an emission layer including a first ZnO-containing semiconductor layer and disposed between said first semiconductor layer and said second semiconductor layer;
    a first electrode electrically connected to said first semiconductor layer; and
    a second electrode electrically connected to said second semiconductor layer,
    wherein said first ZnO-containing semiconductor layer is a ZnO-containing semiconductor layer selected from a group consisting of a ZnO-containing semiconductor layer doped with Se, having an emission peak wavelength in a range of 580 nm or longer to 640 nm or shorter, and having a band gap equivalent to a band gap of ZnO, and a ZnO-containing semiconductor layer doped with Se, having an emission peak wavelength in a range of 520 nm or longer to 530 nm or shorter and having a band gap equivalent to a band gap of ZnO.

10. The semiconductor light emitting device according to claim 9, wherein said emission layer further includes a second ZnO-containing semiconductor layer, and said second ZnO-containing semiconductor layer is a ZnO-containing semiconductor layer selected from said group and having an emission peak wavelength different from said first ZnO-containing semiconductor layer.

11. The semiconductor light emitting device according to claim 10, wherein said emission layer has a multi quantum well structure, and said first ZnO-containing semiconductor layer and said second ZnO-containing semiconductor layer are well layers of said multi quantum well structure.

12. The semiconductor light emitting device according to claim 10, wherein said emission layer further includes a third ZnO-containing semiconductor layer and said third ZnO-containing semiconductor layer is a ZnO-containing semiconductor layer selected from said group and having an emission peak wavelength different from both said first and second ZnO-containing semiconductor layers.

13. A semiconductor light emitting device comprising:
    a first semiconductor layer of a first conductivity type;
    a second semiconductor layer of a second conductivity type opposite to said first conductivity type;
    an emission layer including a first ZnO-containing semiconductor layer and disposed between said first semiconductor layer and said second semiconductor layer;
    a first electrode electrically connected to said first semiconductor layer; and
    a second electrode electrically connected to said second semiconductor layer,
    wherein said first ZnO-containing semiconductor layer is a ZnO-containing semiconductor layer selected from a group consisting of a ZnO-containing semiconductor layer doped with Se, having an emission peak wavelength in a range of 430 nm or longer to 490 nm or shorter, and having a band gap equivalent to a band gap of ZnO, a ZnO-containing semiconductor layer doped with Se, having an emission peak wavelength in a range of 580 nm or longer to 640 nm or shorter, and having a band gap equivalent to a band gap of ZnO, and a ZnO-containing semiconductor layer doped with Se, having an emission peak wavelength in a range of 520 nm or longer to 530 nm or shorter and having a band gap equivalent to a band gap of ZnO, and
    wherein said emission layer further includes a second ZnO-containing semiconductor layer, and said second ZnO-containing semiconductor layer is a ZnO-containing semiconductor layer selected from said group and having an emission peak wavelength different from said first ZnO-containing semiconductor layer.

14. The semiconductor light emitting device according to claim 13, wherein said emission layer has a multi quantum well structure, and said first ZnO-containing semiconductor layer and said second ZnO-containing semiconductor layer are well layers of said multi quantum well structure.

15. The semiconductor light emitting device according to claim 13, wherein said emission layer further includes a third ZnO-containing semiconductor layer and said third ZnO-containing semiconductor layer is a ZnO-containing semiconductor layer selected from said group and having an emission peak wavelength different from both said first and second ZnO-containing semiconductor layers.

* * * * *